United States Patent
Dietze et al.

(12) 
(10) Patent No.: US 6,395,085 B2
(45) Date of Patent: May 28, 2002

(54) PURITY SILICON WAFER FOR USE IN ADVANCED SEMICONDUCTOR DEVICES

(75) Inventors: Gerald R. Dietze; Sean G. Hanna, both of Portland, OR (US); Zbigniew J. Radzimski, Brush Prairie, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/759,029

(22) Filed: Jan. 11, 2001

Related U.S. Application Data (63) Continuation-in-part of application No. 09/567,659, filed on May 9, 2000, which is a continuation-in-part of application No. 09/353,196, filed on Jul. 14, 1999, now abandoned, and a continuation-in-part of application No. 09/353,197, filed on Jul. 14, 1999.

(51) Int. Cl.[7] .............................................. C30B 15/20
(52) U.S. Cl. ............................ 117/29; 117/13; 117/14; 117/90; 117/97
(58) Field of Search .............................. 117/13, 14, 29, 117/89, 90, 97

(56) References Cited

U.S. PATENT DOCUMENTS

| | | |
|---|---|---|
| 2,842,467 A | 7/1958 | Landauer et al. |
| 4,330,359 A | 5/1982 | Shlichta |
| 4,468,260 A | 8/1984 | Hiramoto |
| 4,533,820 A | 8/1985 | Shimizu |
| 4,540,876 A | 9/1985 | McGinty |
| 4,548,670 A | 10/1985 | Pinkhasov |
| 4,821,674 A | 4/1989 | deBoer et al. |
| 5,002,630 A | 3/1991 | Kermani et al. |
| 5,044,943 A | 9/1991 | Bowman et al. |
| 5,108,792 A | 4/1992 | Anderson et al. |
| 5,156,820 A | 10/1992 | Wong et al. |
| 5,223,081 A | 6/1993 | Doan |
| 5,224,503 A | 7/1993 | Thompson et al. |
| 5,248,378 A | 9/1993 | Oda et al. |

(List continued on next page.)

FOREIGN PATENT DOCUMENTS

| | | |
|---|---|---|
| DE | 10 47 390 B | 12/1958 |
| EP | 0 319 031 A2 | 6/1989 |
| EP | 0 462 741 A2 | 12/1991 |
| GB | 2 198 966 A | 6/1988 |
| JP | 62-275087 A | 11/1987 |
| JP | 04091427 A | 3/1992 |
| WO | WO 86/02919 A1 | 11/1984 |
| WO | WO 99/57344 A1 | 11/1999 |

OTHER PUBLICATIONS

*ASM–Advanced Semiconductor Materials,* Operation and Maintenance, Reactor Section, Nov. 95, p. 7–1.
*Webster's New Collegiate Dictionary,* 1975, G. & C. Merriam Co., p. 887.
*CZ Silicon Crystal Grown in Transverse Magnetic Fields,* K. Hoshi et al., Extended Abstracts, vol. 80–1, 1980, pp. 811–813.
*Controlling the Oxygen Concentration of Silicon Crystals by Magnetically Induced Melt Rotation,* E. M. Hull, IBM Technical Disclosure Bulletin, vol. 23, No. 7A, Dec. 1980.
Semiconductor Silicon Crystal Technology, F. Shimura, Academic Press, Inc., San Diego, CA, 1988, pp. 178–181.

*Primary Examiner*—Felisa Hiteshew
(74) *Attorney, Agent, or Firm*—Alston & Bird LLP (57) ABSTRACT

A method of manufacturing a high-purity epitaxial silicon wafer is provided. The method includes providing a quartz crucible for melting silicon; adding silicon to the crucible; heating the crucible to form a melt; applying an electrical potential across the crucible; pulling a silicon crystal from the melt; forming a silicon wafer from the silicon crystal, the wafer having a frontside and a backside; and simultaneously depositing an epitaxial first silicon film on the frontside of the wafer and a polycrystalline second silicon film on the backside of the wafer.

21 Claims, 4 Drawing Sheets

U.S. PATENT DOCUMENTS

| | | |
|---|---|---|
| 5,357,898 A | 10/1994 | Kurosawa et al. |
| 5,421,893 A | 6/1995 | Perlov |
| 5,474,020 A | 12/1995 | Bell et al. |
| 5,489,341 A | 2/1996 | Bergman et al. |
| 5,493,987 A | 2/1996 | McDiarmid et al. |
| 5,500,081 A | 3/1996 | Bergman |
| 5,584,310 A | 12/1996 | Bergman et al. |
| 5,723,337 A | 3/1998 | Muller et al. |
| 5,762,751 A | 6/1998 | Bleck et al. |
| 5,779,791 A | 7/1998 | Korb et al. |
| 5,803,977 A | 9/1998 | Tepman et al. |
| 5,846,073 A | 12/1998 | Weaver |
| 5,863,843 A | 1/1999 | Green et al. |
| 5,882,398 A | 3/1999 | Sonokawa et al. |
| 5,895,596 A | 4/1999 | Stoddard et al. |
| 5,899,731 A | 5/1999 | Kai et al. |
| 5,904,478 A | 5/1999 | Weaver et al. |
| 5,908,292 A | 6/1999 | Smith et al. |
| 5,911,826 A | 6/1999 | Hiraishi et al. |
| 5,911,889 A | 6/1999 | Fabry et al. |
| 5,935,320 A | 8/1999 | Graef et al. |
| 5,951,775 A | 9/1999 | Tepman |
| 5,954,873 A | 9/1999 | Hourai et al. |
| 5,964,953 A | 10/1999 | Mettifogo |
| 5,972,116 A | 10/1999 | Takagi |
| 5,976,983 A | 11/1999 | Miyazaki et al. |
| 6,053,982 A | 4/2000 | Halpin et al. |
| 6,059,875 A | 5/2000 | Kirkland et al. |
| 6,077,343 A | 6/2000 | Iida et al. |
| 6,086,680 A | 7/2000 | Foster et al. |
| 6,228,165 B1 | 5/2001 | Baba et al. |

PURITY SILICON WAFER FOR USE IN ADVANCED SEMICONDUCTOR DEVICES

CROSS-REFERENCE TO RELATED APPLICATIONS

This application is a continuation-in-part of application Ser. No. 09/567,659, filed May 9, 2000 now allowed, which is a continuation-in-part of application Ser. No. 09/353,196 abandoned, filed Jul. 14, 1999 and application Ser. No. 09/353,197 pending, filed Jul. 14, 1999, the disclosures of which are incorporated by reference herein.

TECHNICAL FIELD

The present invention relates to a method of manufacturing a semiconductor wafer, and more particularly to a method of manufacturing an epitaxial wafer of high purity.

BACKGROUND OF THE INVENTION

The fabrication of many advanced silicon devices requires the use of semiconductor wafers with precise electrical characteristics. Often, the electrical properties of the wafer are engineered by depositing a layer of epitaxial silicon with precisely controlled levels of dopants onto the frontside of the wafer. A wafer with such a layer is known as an epitaxial wafer.

The precise engineering of the electrical properties of an epitaxial wafer requires the concentration of dopants within the wafer to be closely controlled. The presence of impurities other than the desired levels of dopants can degrade wafer performance in several ways. First, some impurities are mobile in the silicon lattice, and others are capable of donating carriers to the wafer. These impurities may degrade wafer performance by changing the conductivity of the wafer. Other impurities may cause defects, such as dislocations, in the crystal structure of the wafer. The presence of these defects may lead to higher leakage currents and lower breakdown voltages in devices fabricated on the wafer.

The manufacture of an extremely pure epitaxial wafer can be difficult, as many steps in the overall manufacturing process can potentially cause contamination of the wafers. One example is the crystal growing process. First, the many metal instruments used in the crystal growing process can contaminate the melt with metallic impurities. These impurities may then be incorporated into a silicon crystal pulled from the melt. Second, the crucible from which the crystal is pulled is generally made of a silicon dioxide compound, such as quartz. Prolonged exposure to the melt can cause the wall of the crucible to undergo phase transformations to other crystalline silicate phases, such as β-cristobalite. The phases may be either more or less resistant to the melt than the surrounding regions of the crucible. This can result in the undercutting of the more resistant regions as the melt erodes away the less resistant regions more rapidly. Such undercutting can cause small particles from the crucible wall to be released into the melt. These particles may be incorporated into the growing crystal, possibly causing defects to form in the crystal lattice.

Another process that can result in the contamination of the epitaxial layer is the epitaxial deposition process itself. Often, the wafer on which the epitaxial layer is to be deposited is heavily doped with a dopant such as boron. When the wafer is heated for the epitaxial deposition process, there is a danger that the dopant may diffuse out of the lattice from the wafer backside and cause contamination of the growing epitaxial film. To prevent this, many epitaxial deposition processes include an oxide back seal step to seal the wafer backside before the deposition of the epitaxial film. The oxide back seal helps to prevent the dopant from contaminating the epitaxial layer, but the extra process steps necessary for the oxide deposition can themselves introduce contaminants into the wafer. Furthermore, for the fabrication of some devices, it may be necessary to use an epitaxial wafer that has had its oxide back seal removed. The removal of the oxide back seal is generally performed with an hydrofluoric acid stripping step. As with many wet-chemical processes, the HF stripping step can introduce contaminants into the epitaxial layer of the wafer, and thus can potentially hurt device performance.

SUMMARY OF THE INVENTION

The present invention provides a method of manufacturing a high-purity epitaxial silicon wafer. The method includes providing a quartz crucible for melting silicon; adding silicon to the crucible; heating the crucible to form a melt; applying an electrical potential across the crucible; pulling a silicon crystal from the melt; forming a silicon wafer from the silicon crystal, the wafer having a frontside and a backside; and simultaneously depositing an epitaxial first silicon film on the frontside of the wafer and a polycrystalline second silicon film on the backside of the wafer.

DETAILED DESCRIPTION OF THE PREFERRED EMBODIMENTS

Figure 1:
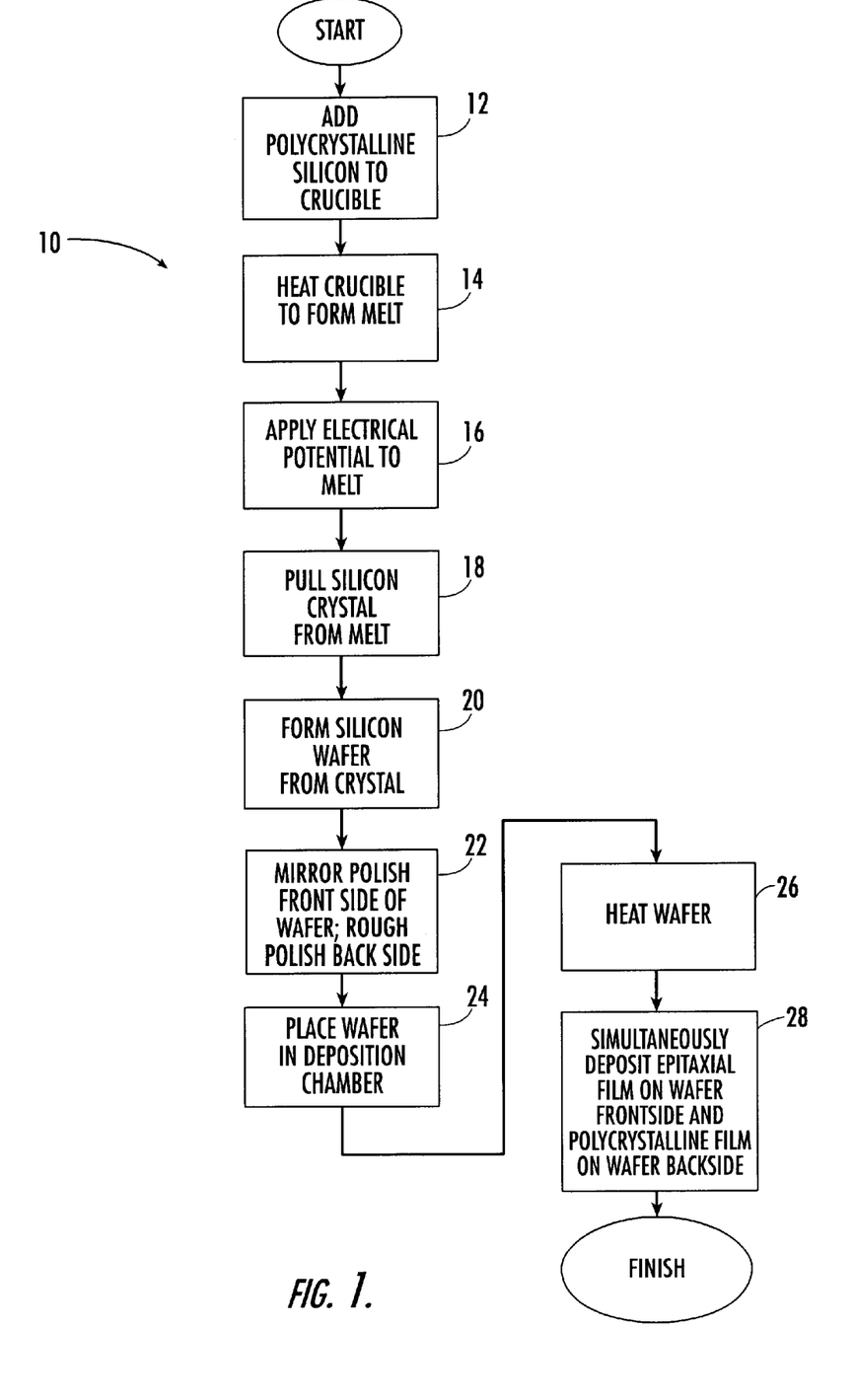
FIG. 1 is a flow diagram showing a method of manufacturing a silicon wafer according to an embodiment of the present invention.

The present invention provides an economical method of manufacturing an epitaxial wafer of high purity. The method is particularly suited for manufacturing a silicon wafer, but may be used to manufacture any desired semiconductor wafer. One embodiment of the invention is illustrated generally at 10 in FIG. 1 as a method of manufacturing an epitaxial silicon wafer. Method 10 includes forming a melt from which a silicon crystal may be pulled by first adding polycrystalline silicon to a crucible at 12, and then heating the crucible to form a melt at 14. After the melt has been formed, an electrical potential is applied across the crucible at 16 between the inner surface of the crucible and the outer surface of the crucible. Next, a silicon crystal is pulled from the melt at 18 according to the Czochralski technique while the electrical potential is maintained across the crucible for at least part of the duration of the crystal pulling process. After the crystal has been pulled from the melt, a silicon wafer is formed from the crystal at 20. Next, the wafer is lapped at 22 and etched at 24. Then, frontside of the wafer is mirror polished at 26. The wafer backside may also be mirror or rough polished at this time if desired. After the polishing step, the wafer is placed into a deposition chamber at 28, and is heated at 30. Finally, when the wafer has reached a desired temperature, reactant gas is flowed simultaneously over the frontside and the backside of the wafer at 32. The conditions in the deposition chamber are set to cause an epitaxial film to grow on the front surface of the wafer. However, because the bottom surface of the wafer is not mirror polished, but is still somewhat rough from the wafer-forming at 20, a polycrystalline film is grown on the bottom of the wafer at the same time the epitaxial film is grown on the front surface.

The step of applying the electrical potential to the crucible while pulling the crystal combined with the step of simultaneously depositing an epitaxial film on the frontside of the wafer and a polycrystalline film on the backside of the wafer produces an epitaxial wafer of extremely high purity. First, applying an electrical potential to the crucible while pulling a crystal from the melt helps to prevent impurities from being incorporated into the growing crystal. This is because the application of an electrical potential across the crucible reduces, or possibly even eliminates, the release of particles of β-cristobalite into the melt. While the exact process by which applying an electrical potential to a crucible prevents the release of β-cristobalite into the silicon melt is not known in detail, it is believed that the electrical potential causes substantially the entire inner surface of the crucible to undergo the phase transformation to β-cristobalite. This reduces the chance of regions of β-cristobalite present on the inner surface of the crucible from being undercut and released into the melt. Furthermore, the application of the electric potential also may impede the incorporation of metallic contaminants in the melt into the crystal. This is because the electric field can cause metallic impurities in ionic form to migrate to the crucible wall.

Furthermore, the simultaneous deposition of an epitaxial film on the frontside of the wafer and a polycrystalline film on the backside of the wafer prevents contaminants from the backside of the wafer from diffusing to the wafer frontside and contaminating the growing epitaxial film, and also improves dopant uniformity in the epitaxial layer. This eliminates the need for an oxide back seal. The deposition of the polycrystalline film seals any particulate impurities present on the backside of the wafer within the first few moments of the process, trapping the impurities and reducing the danger of the impurities from contaminating the wafer frontside or impeding epitaxial growth. Also, the polycrystalline silicon layer retards the outgassing of any dopants in the bulk silicon lattice, reducing the chances of the dopants contaminating the epitaxial film. Finally, the polycrystalline silicon layer improves dopant uniformity in the epitaxial layer, which allows the use of larger resistivity ranges.

The simultaneous deposition of the epitaxial and polycrystalline films has other benefits besides reducing contamination. First, the epitaxial film on the frontside of the wafer covers surface defects, such as crystalline originated particles (COP), present on the frontside, thus improving the surface for device fabrication. Second, the deposition of the polycrystalline film on the backside of the wafer creates extrinsic gettering sites. The grain boundaries in the polycrystalline material create strain, causing defects that can trap mobile impurities. Thus, the polycrystalline layer can getter contaminants that might otherwise contaminate the growing epitaxial layer.

The adding of silicon to the crucible at 12 may be performed in any suitable manner. Generally, electrical grade polycrystalline silicon is added to a fused silica or quartz crucible in either chunk or granular form. If desired, a dopant other than nitrogen may be added to the crucible along with the polycrystalline silicon to form a p or n type crystal. This dopant may similarly be added to the crucible in any desired manner, such as by adding a heavily-doped silicon alloy to the crucible along with the polycrystalline silicon.

After the silicon has been added to the crucible, the crucible is heated to form a melt at 14. The heating process generally involves first pumping down the pulling chamber, backfilling the chamber with an inert gas and then heating the crucible until the silicon is melted. The crucible is typically heated and supported by a susceptor. The susceptor, in turn, is usually heated by one or more heating elements arranged around the susceptor.

Figure 2:
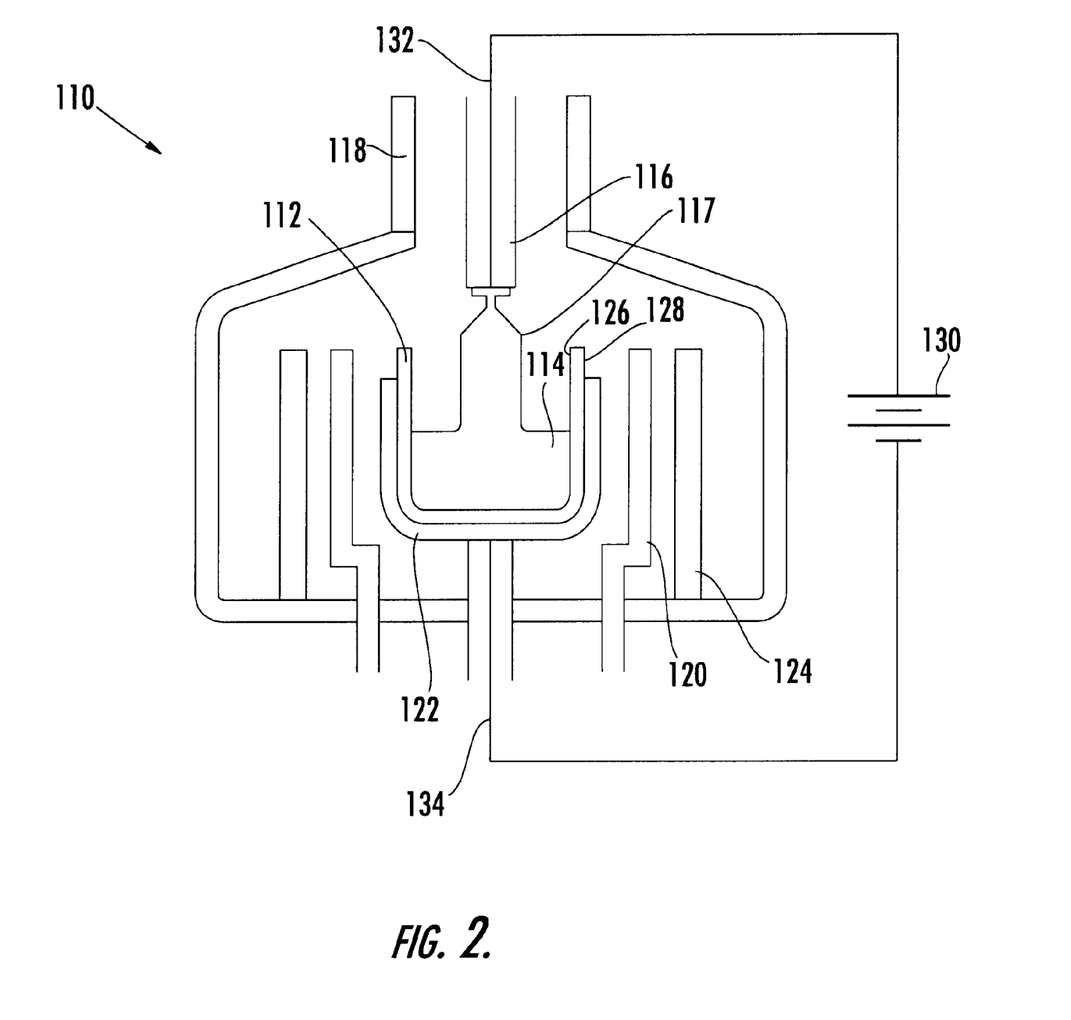
FIG. 2 is a sectional view of a puller suitable for pulling a crystal according to the embodiment of FIG. 1.

Once the melt has been formed, an electrical potential is applied across the crucible at 16. Any suitable method of applying an electrical potential across the crucible may be used. One embodiment of a suitable crystal pulling system for applying the electrical potential across the crucible is shown in FIG. 2 at 110. Pulling system 110 includes a crucible 112, typically made of a silicon-based material such as quartz or fused silica, in which silicon may be melted to form a melt 114. Pulling system 110 also includes a pulling member 116 for pulling a crystal 117 from crucible 112. Pulling member 116 is configured for holding a seed crystal that is dipped into melt 114 to initiate crystal growth, and for pulling crystal 117 from melt 114 as it grows. Pulling member 116 is coupled to various drive mechanisms (not shown) to control the upward and rotational movement of the member while crystal 117 is being pulled. Pulling system 110 also includes an outer wall 118 for isolating the melt from the outside atmosphere, one or more heating elements 120 for heating crucible 112, and a susceptor 122 in contact with crucible 112 for transferring heat to crucible 112. Heating element 120 and susceptor 122 are typically made of a refractory, electrically and thermally conductive material such as graphite. This allows susceptor 122 to support crucible 112 if the crucible softens during heating. A heat-insulating cylinder 124 may surround heating element 120 between outer wall 118 and heating element 120.

Pulling system 110 may be configured to allow an electrical potential to be applied across crucible 112 at 16 in any suitable fashion. In the depicted embodiment, pulling system 110 is configured to allow a first potential relative to ground to be applied to the inner surface 126 of the crucible, and a second potential relative to ground to be applied to the outer crucible surface 128. In the depicted embodiment, the first potential is applied to inner crucible surface 126 by applying the first potential to pulling member 116, and the second potential is applied to outer crucible surface 128 by applying the second potential to susceptor 122. A power supply 130 is connected across the crucible via a first lead 132 attached to pulling member 116 and a second lead 134 attached to susceptor 122. The first potential is transferred through crystal 117 and melt 114 to inner crucible surface 126, while the second potential is transferred through susceptor 122 to outer crucible surface 128.

Any suitable power supply that is capable of providing the desired electrical potential across the crucible may be used. Typically, the electrical potential will have a magnitude in the range of 1–100 V, more typically in the range of 3–24 V, and even more typically in the range of 8–12 V, although values outside of these ranges may also be used. Such voltages will typically result in the flow of a current in the range of from about 0.1 to about 300 mA, and more typically from about 1 to about 200 mA, through the crucible wall, though a current outside these values may also result from the potential applied across the crucible.

The electrical potential may be either constant or oscillating. If a constant potential is applied across the crucible, the more positive terminal of the power supply may be applied either to pulling member 216 or to susceptor 222, although it is typically applied to susceptor 222. In a particularly preferred embodiment of the invention, a 12 V DC potential is applied across the crucible at a current of about 2 to 15 mA.

The electrical potential may be applied across the crucible for any portion of the pulling process, or for the entire pulling process. Generally, the crystal is pulled from the melt at 18 according to the Czochralski technique. This technique involves first lowering a seed crystal into the melt to form a solid-liquid interface, and then pulling the seed crystal upward in such a manner that a silicon crystal continually grows at the solid-liquid interface. The crucible and crystal are continuously rotated in opposite directions as the crystal is pulled upward.

Once the silicon crystal has been pulled from the melt, a wafer may be formed from the crystal at 20. Forming the wafer from the crystal generally involves several steps. First, the crystal is shaped to remove excess material not used in forming wafers, and flats or notches are ground into the crystal. Next, the wafer is cut from the crystal through a process such as sawing. After cutting the wafer, the wafer edge is shaped, and the wafer is lapped and ground to the correct thickness. Next, the wafer is chemically etched to remove damage from previous processing steps.

After performing the above processes, the surfaces of the wafer are polished at 26. According to the embodiment of FIG. 1, the wafer frontside is mirror polished, and the wafer backside may optionally be rough polished, mirror polished or remain unpolished. Generally, all of the polishing steps are performed using chemical-mechanical polishing techniques well known in the art. These generally involve applying a slurry of sodium hydroxide and silica particles onto the frontside of the wafer, and then polishing the wafer surface with a polishing pad.

The mirror-polishing process gives the wafer a highly polished, scratch- and damage-free frontside, suitable for the deposition of the epitaxial film. The rough-polishing process gives the backside of the wafer a somewhat rougher surface than the mirror polish produces, which tends to encourage the growth of a polycrystalline film on the surface rather than an epitaxial film.

Once the surfaces of the wafer have been polished at 26, the wafer is ready for the simultaneous deposition of the epitaxial film on the frontside of the wafer and the polycrystalline film on the backside of the wafer. The simultaneous deposition process involves several individual steps. First, the wafer is placed into a deposition chamber at 28, and the chamber is prepared for deposition, e.g. by performing any necessary preliminary steps such as pumping the chamber down. The wafer is supported in the chamber on a special holder, described in more detail below, that allows the frontside and backside of the wafer to be simultaneously exposed to a flow of a reactant gas. After the wafer is positioned on the holder, the wafer is heated at 30 so that atoms of the deposited material can migrate across the wafer surface to form the epitaxial film. Finally, after the wafer is heated, reactant gas is flowed over both the frontside and backside at 32, causing the deposition of the epitaxial frontside film and the polycrystalline backside film.

Figure 3:
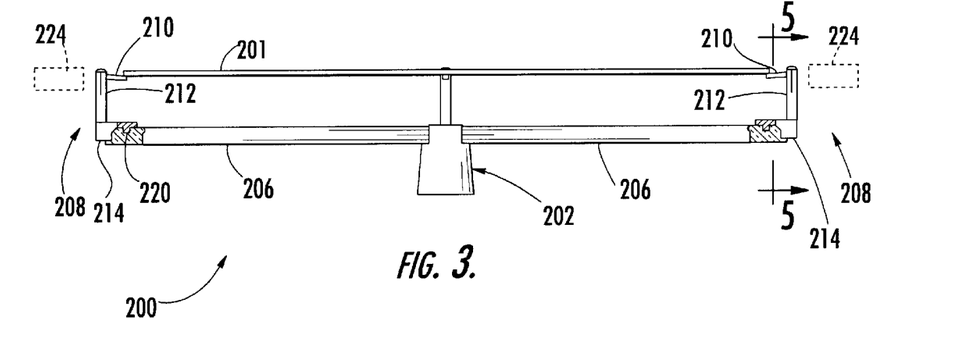
FIG. 3 is a side view of a wafer support for simultaneously depositing an epitaxial film on the wafer frontside and a polycrystalline film on the wafer backside according to the embodiment of FIG. 1.
Figure 4:
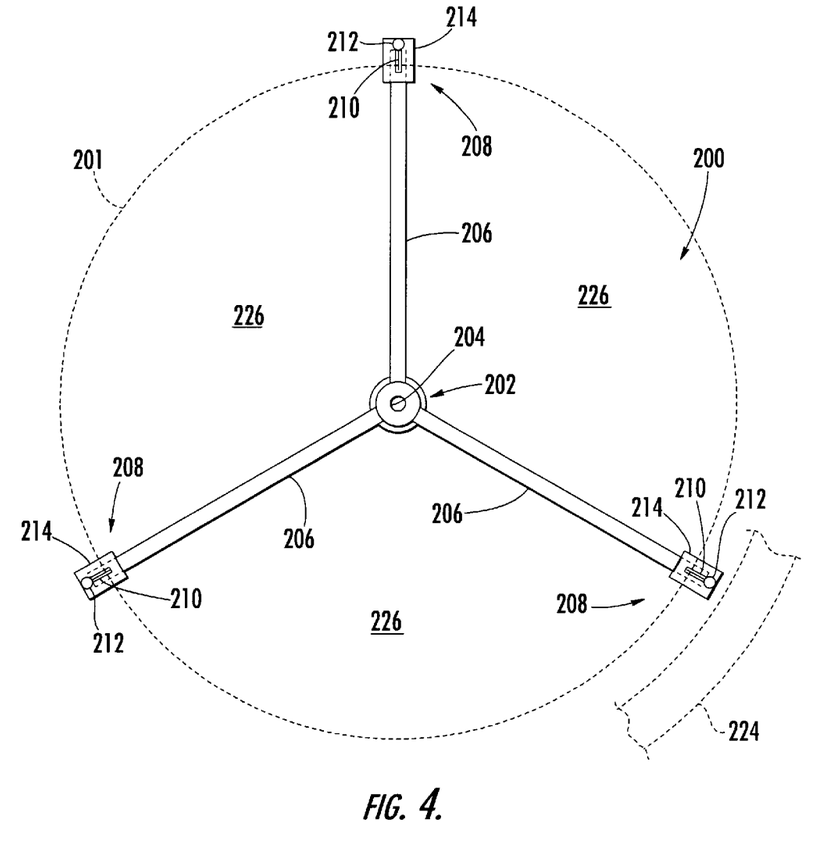
FIG. 4 is a top view of the wafer support of FIG. 3.

The wafer holder that supports the wafer in the deposition chamber must allow both the frontside and the backside of the wafer to be exposed simultaneously to reactant gas. FIGS. 3 and 4 show generally at 200 one embodiment of a suitable wafer holder. Wafer support 200 includes a hub 202 that is flared and configured to be mounted to a mounting shaft (not shown) in an epitaxial deposition system. The shaft supports and rotates wafer support 202 within the deposition chamber. A hole 204 is provided in the top of hub 202, through which a thermocouple may be fed.

Figure 5:
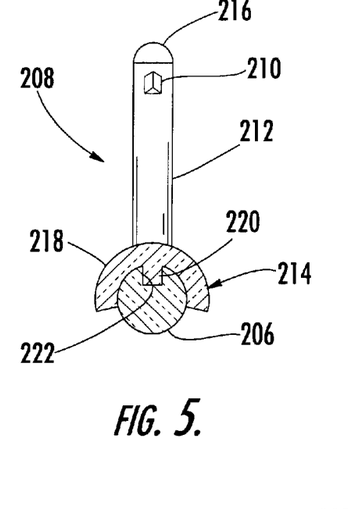
FIG. 5 is a partial cross-sectional view of an arm, coupling member and contact member of the wafer support of FIG. 3.

Wafer support 200 also includes three arms 206 extending radially outward from hub 202. Alternatively, a smaller or greater number of arms may be provided. Arms 206 are typically circular in cross section, as shown in FIG. 5. The top of hub 202 is typically formed horizontally flush with the top of arms 206. Typically, arms 206 extend outward at right angles from hub 202. However, it will be appreciated that arms 206 may extend at another predetermined angle, and/or may curve or spiral outward.

Wafer support 200 includes voids 226 positioned adjacent arms 206. Voids 226 typically extend from backside of wafer 201 to the bottom of the reaction chamber, and are configured to facilitate gas flow to the backside of wafer 201. In addition, voids 226 are configured to allow heat energy to radiate from a lower heat energy source positioned below wafer 201 directly to the backside of wafer 201, without being absorbed by an interfering susceptor or wafer support structure. Typically, wafer support 200 is made of quartz, and is substantially thermally transparent, allowing radiant heat energy to pass directly through its structure.

Wafer support 200 further includes a wafer contact assembly 208 coupled to each arm 206 adjacent a distal end of the arm. Each wafer contact assembly 208 includes a contact member 210 mounted to an upwardly extending support member 212, also referred to as post 212, which is in turn mounted to a respective arm 206 by a coupling member 214.

It is desirable to reduce the thermal mass of contact member 210 near wafer 201, in order to reduce thermal interference that may cause abnormalities in the growth of an epitaxial layer on the wafer, such as a heat shadow in the epitaxial layer caused by conductive heat transfer between wafer 201 and contact member 210. Thus, contact member 210 has a shape with minimal surface area near the contact point with wafer 201. Typically, contact member 210 is triangular in shape, as shown in FIG. 5. Alternatively, contact member 210 may be cylindrical in shape, as shown at 210a in FIG. 8, or may be of some other suitable shape. Typically, the contact member is between about 0.02 and 0.20 inches in width, and preferably is about 0.06 inches in width, at its widest point.

Figures 7, 8, 9:
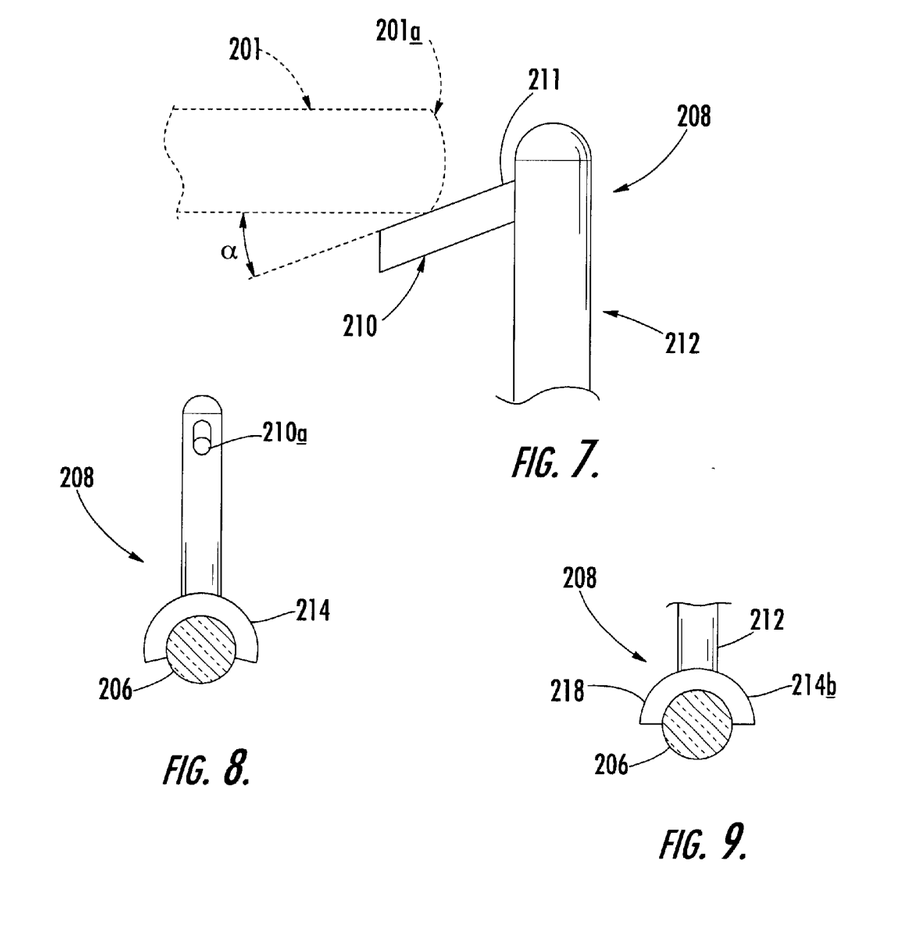
FIG. 7 is a detailed side view of the arm and contact member of the wafer support of FIG. 3.
FIG. 8 is a partial cross-sectional view of a second embodiment of a contact member of the wafer support of FIG. 3.
FIG. 9 is a partial cross-sectional view of a third embodiment of the coupling member of the wafer support of FIG. 3.

As shown in FIG. 7, contact member 210 typically extends inwardly and downwardly from post 212. The contact member extends downward from a point above the bottom surface of wafer 201 to a point below the bottom surface. Contact member 210 includes a downwardly sloping top surface portion 211 that is configured to contact an outer edge 201a of wafer 201. The top surface portion 211 of contact member 210 is angled downward at an angle α relative to the horizontal, such that angle α is greater than zero degrees. Thus, contact member 210 contacts the wafer 201 at one point of contact, thereby reducing the thermal interference caused by the wafer support on epitaxial layer growth on the wafer.

Typically, angle α is between about zero and 22 degrees. In one preferred embodiment of the invention, angle α is between zero and 15 degrees. In another preferred embodiment of the invention, angle α is between about zero and 10 degrees, and in a particularly preferred embodiment, angle α is about 4 degrees. It has been found that in these ranges, the wafer tends to center itself upon the three contact members when dropped by a paddle or other loading device onto the contact members 210 of wafer support 200. The wafer vibrates slightly as it hits the contact members, and tends towards a centered position because of the inward slope of the contact members. Thus, successive wafers may be positioned in substantially the same position during the epitaxial growth process, thereby assuring a uniform quality in the epitaxial layers grown on the wafers.

Post 212 typically is mounted to coupling member 214 at a lower end and extends from a point below the bottom surface of wafer 201 to a point above the bottom surface of wafer 201. Post 212 typically includes a rounded top 216, which reduces interference in the gas flow to outer edge 201a of wafer 201. In addition, post 212 is usually circular in cross section. Post 212 is typically positioned outward of the outer edge of the wafer.

Coupling member 214 includes a semi-cylindrical member 218 that extends slightly more than 180 degrees around arm 206. The contact assembly is typically quartz. The limited inherent flexibility in this material enables the walls of the semi-cylindrical member 218 to be temporarily bent slightly outward to enable installation of semi-cylindrical member 218 onto arm 206. Alternatively, contact assembly 208 may include a coupling member 214b with a semi-cylindrical member that extends 180 degrees, or less, around arm 206, as shown in FIG. 9.

Figure 6:
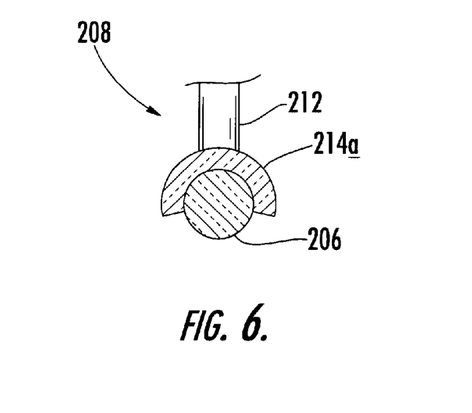
FIG. 6 is a partial cross-sectional view of a second embodiment of the arm and coupling member of the wafer support of FIG. 3.

Coupling member 214 also typically includes a protrusion 220 extending from the semi-cylindrical member 218 into a slot 222 in arm 206. The mating of protrusion 220 and slot 222 serve to secure coupling member 214 on arm 206. Alternatively, the contact assembly may include a coupling member 214a without any protrusion, as shown in FIG. 6. It will be understood that coupling member 214 also may be secured to arm 206 by interference fit, welding or fusing, or other suitable attachment method.

A heat-absorbing ring 224 may also be placed around an outside edge of the wafer 201, adjacent an outer side of each of the wafer contact assemblies 208. Heat-absorbing ring 224 is typically at least as thick as wafer 201. Typically, heat-absorbing ring is made of graphite. Alternatively, another suitable material may be used. Heat-absorbing 224 ring serves to absorb and evenly distribute heat to the edge of wafer 201.

Though the wafer holder depicted in FIGS. 3–9 is a preferred wafer holder, any wafer holder that permits a reactant gas to flow simultaneously over the frontside and the backside of the wafer may also be used to support the wafer in an epitaxial deposition chamber, such as the holders disclosed in the above-referenced U.S. patent application Ser. No. 09/567,659 for a SUSCEPTORLESS SEMICONDUCTOR WAFER SUPPORT AND REACTOR SYSTEM FOR EPITAXIAL LAYER GROWTH, filed May 9, 2000.

After the wafer is placed in the vapor deposition chamber at 28, the wafer is heated at 30 to a predetermined deposition temperature. Wafer holder 200 offers an additional advantage of the present method over known deposition methods, as wafer holder 200 allows the frontside and backside of a wafer to be directly heated without having to heat a susceptor. Typically, heat energy is radiated directly to the frontside and backside of the wafer. The radiant energy can pass directly through voids 226 in wafer support 200 to the backside of the wafer. Voids 226 in wafer support 200 enable the heat energy source to heat the wafer without substantial structural interference by a susceptor or the wafer support. In addition, voids 226 decrease the thermal mass of wafer support 200. Therefore, compared to prior reactors with susceptors, the present invention enables the wafer to be heated more directly and quickly, further lowering the overall cost of the wafer manufacturing process.

The wafer is heated until it reaches a predetermined process temperature for the simultaneous growth of the epitaxial silicon film on the wafer frontside and the polycrystalline film on the wafer backside. The process temperature typically is between 900 and 1200 degrees Celsius. A thermocouple may be positioned within hole 204 so that it is proximate the wafer to sense the temperature of the reaction chamber adjacent the wafer. To reduce thermal interference with the wafer, the thermocouple typically does not contact the wafer.

After the wafer is heated at 30, a reactant gas is flowed simultaneously over the frontside and backside of the wafer at 32. The gas flows over the backside of the wafer by flowing through voids 226. The smooth surface of the mirror-polished wafer frontside allows an epitaxial film to grow on the frontside. However, because the wafer backside is not mirror polished, but rough in comparison to the frontside, a polycrystalline film grows on the backside. The reactant gas may be any gas capable of depositing a high-purity epitaxial film of the desired material onto the frontside of the wafer. Typical gases include silane, silicon tetrachloride and others.

Once the epitaxial film and the polycrystalline film have been simultaneously deposited on the front and back surface of the wafer, respectively, any particulate impurities present on the backside of the wafer will be sealed underneath the polycrystalline film. Likewise, the possibility of lattice dopants such as boron from outgassing from the wafer backside and contaminating the wafer frontside is reduced.

Industrial Applicability

The present invention is applicable to the manufacture of semiconductor wafers, and is particularly applicable to the manufacture of a epitaxial silicon wafer of high purity.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A method of manufacturing a silicon wafer, comprising:
   providing a crucible;
   adding silicon to the crucible;
   heating the crucible to form a melt;
   applying an electric potential across the crucible;
   pulling a first silicon crystal from the melt;
   forming a silicon wafer from the silicon crystal, the wafer having a front side and a back side; and
   a step for preventing impurities from contaminating the silicon wafer.

2. The method of claim 1, further comprising pulling a second silicon crystal from the melt after pulling the first silicon crystal from the melt.

3. A method of manufacturing a high-purity epitaxial silicon wafer, comprising:
   providing a crucible for melting silicon;
   adding silicon to the crucible;
   heating the crucible to form a melt;
   applying an electrical potential across the crucible;
   pulling a silicon crystal from the melt;
   forming a silicon wafer from the silicon crystal, the wafer having a frontside and a backside; and
   simultaneously depositing an epitaxial first silicon film on the frontside of the wafer and a polycrystalline second silicon film on the backside of the wafer.

4. The method of claim 3, wherein providing a crucible for melting silicon includes providing a crucible with a susceptor for heating the crucible, wherein the susceptor is in electrical and thermal communication with the crucible.

5. The method of claim 4, further comprising providing a pulling member for pulling the silicon crystal from the melt, wherein applying an electrical potential across the crucible includes applying a first electrical potential relative to ground to the pulling member and applying a second electrical potential relative to ground to one of the crucible and the susceptor.

6. The method of claim 3, wherein applying an electrical potential across the crucible includes applying a potential of 3–24 V across the crucible.

7. The method of claim 3, wherein applying an electrical potential across the crucible includes applying a potential of 8–12 V across the crucible.

8. The method of claim 3, wherein applying an electrical potential across the crucible includes generating the potential with a current of 0.1–300 mA.

9. The method of claim 3, wherein applying an electrical potential across the crucible includes applying a DC potential across the crucible.

10. The method of claim 3, wherein pulling the silicon crystal from the melt has a duration, and wherein applying an electrical potential across the crucible includes applying an electrical potential across the crucible for the duration of pulling the silicon crystal from the melt.

11. The method of claim 3, wherein simultaneously depositing an epitaxial first silicon film on the frontside of the wafer and a polycrystalline second film on the backside of the wafer includes trapping impurities present on the backside of the wafer with the second film.

12. The method of claim 3, wherein simultaneously depositing an epitaxial first silicon film on the frontside of the wafer and a polycrystalline second silicon film on the backside of the wafer includes simultaneously depositing the first film and second film by vapor phase deposition.

13. The method of claim 12, wherein simultaneously depositing an epitaxial first silicon film on the frontside of the wafer and a polycrystalline second silicon film on the backside of the wafer by vapor phase deposition includes placing the wafer in a deposition chamber on a wafer holder having a void adjacent the backside of the wafer, and flowing a reactant gas simultaneously over the front and backsides of the wafer to deposit the first and second films on the wafer.

14. A method of manufacturing a silicon wafer, comprising:
   providing a crucible, the crucible having an inner surface and an outer surface defining a wall therebetween;
   providing a pulling member for pulling a silicon crystal from the crucible;
   adding silicon to the crucible;
   applying an electric potential across the wall of the crucible;
   heating the crucible to form a silicon melt;
   forming a silicon crystal from the melt;
   forming a silicon wafer from the silicon crystal, the silicon wafer having a frontside and a backside; and
   simultaneously depositing a epitaxial first film on the frontside of the wafer and a second film on the back surface of the wafer, the second film being an extrinsic gettering layer.

15. The method of claim 14, wherein providing a crucible includes providing a crucible with an outer surface that is in thermal and electrical communication with a susceptor.

16. The method of claim 15, wherein applying an electrical potential across the crucible includes applying a first electrical potential relative to ground to one of the susceptor and the outer wall of the crucible, and applying a second electrical potential relative to ground to the pulling member such that the second potential is applied to the inner surface of the crucible through the melt.

17. The method of claim 14, wherein simultaneously depositing a first epitaxial film on the frontside of the wafer and a second film on the backside of the wafer includes depositing a polycrystalline second film on the backside of the wafer.

18. The method of claim 17, wherein depositing a polycrystalline second film on the backside of the wafer includes depositing a polycrystalline silicon film on the backside of the wafer.

19. A method of manufacturing a high-purity epitaxial silicon wafer, comprising:
   providing a crucible containing a silicon melt;
   applying an electrical potential across the crucible;
   pulling a silicon crystal from the melt while applying the electrical potential to the crucible;
   forming a wafer from the silicon crystal, the wafer having a frontside and a backside;

polishing the silicon wafer; and simultaneously depositing an epitaxial first film on the frontside of the wafer and a second film on the backside of the wafer such that the second film prevents impurities on the backside of the wafer from contaminating the first film as the first film grows.

20. The method of claim 19, wherein depositing a second film on the backside of the wafer includes depositing a polycrystalline second film on the backside of the wafer, the polycrystalline second film including grain boundaries which act as gettering sites.

21. The method of claim 19, wherein the epitaxial first film is an epitaxial silicon film, and wherein the polycrystalline second film is a polycrystalline silicon film.

* * * * *